United States Patent
Cuevas

[19]

[11] Patent Number: 6,150,829
[45] Date of Patent: Nov. 21, 2000

[54] THREE-DIMENSIONAL PROGRAMMABLE CONNECTOR

[75] Inventor: Peter P. Cuevas, Los Gatos, Calif.

[73] Assignee: Qualitau, INC, Sunnyvale, Calif.

[21] Appl. No.: 09/285,686

[22] Filed: Apr. 5, 1999

[51] Int. Cl.[7] .................................................. G01R 31/02
[52] U.S. Cl. .......................................... 324/760; 324/761
[58] Field of Search .................................... 324/760, 761, 324/765, 763; 439/43–54, 651, 652, 655

[56] References Cited

U.S. PATENT DOCUMENTS

| | | | |
|---|---|---|---|
| 5,570,032 | 10/1996 | Atkins et al. | 324/760 |
| 5,672,981 | 9/1997 | Fehrman | 324/760 |
| 5,825,171 | 10/1998 | Shin | 324/760 |
| 5,996,021 | 10/1999 | Eliashberg | 324/760 |

*Primary Examiner*—Safet Metjahic
*Assistant Examiner*—James C Kerveros
*Attorney, Agent, or Firm*—Burns Doane Swecker & Mathis L.L.P.

[57] ABSTRACT

A three dimensional programmable connector used in a burn-in test system for manufactured integrated circuits is provided with a plurality of planar electrodes which are selectively connectable to each other and to a load board on which the integrated circuit is mounted. To implement the selective connection, programming pins are inserted in channels formed in the three-dimensional programmable connector in discrete configurations associated with various routing schemes depending on the particular wiring configuration desired, thereby enabling efficient, repeatable and cost-effective testing and analysis of the integrated circuit.

10 Claims, 3 Drawing Sheets

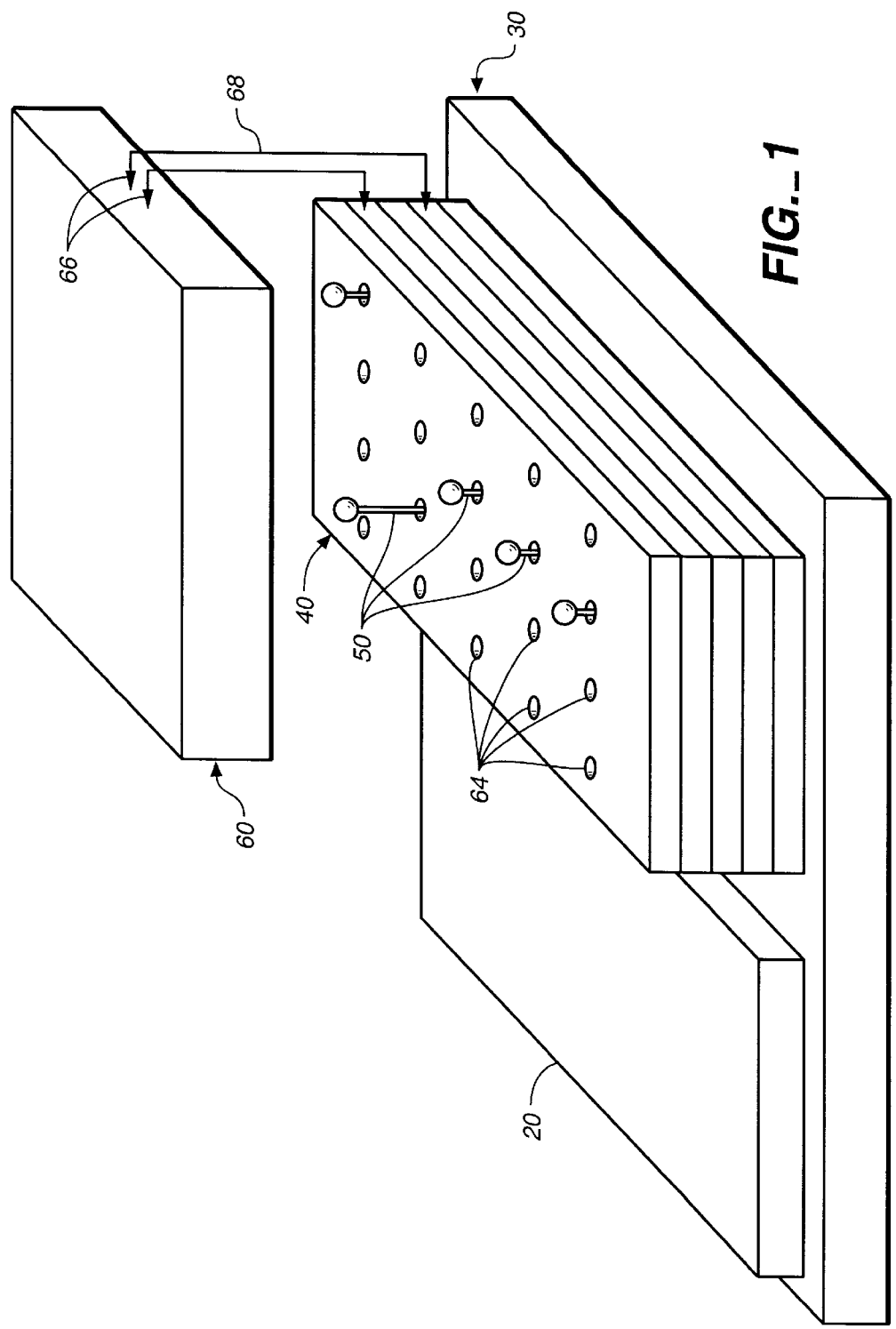
FIG._1

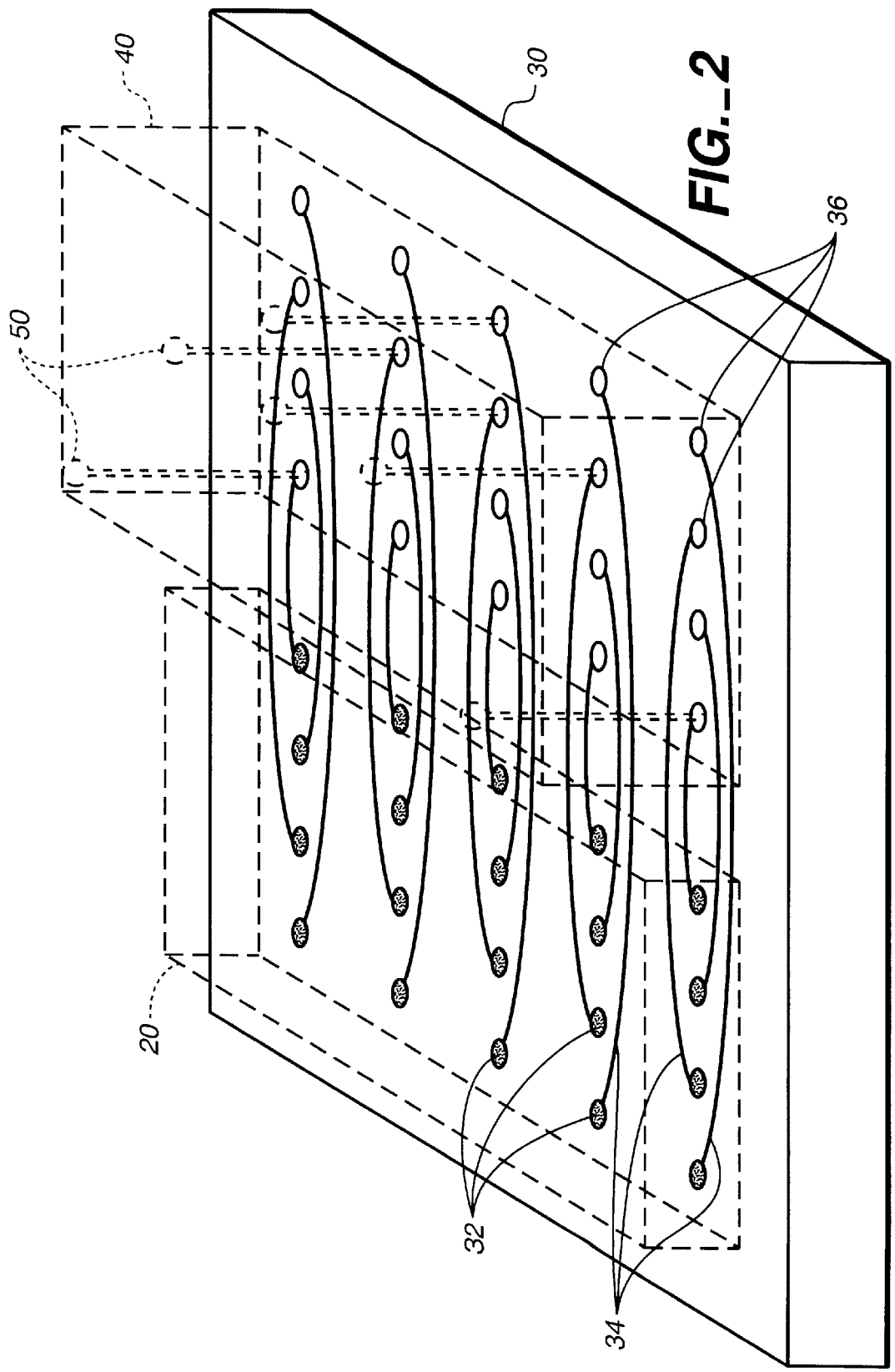

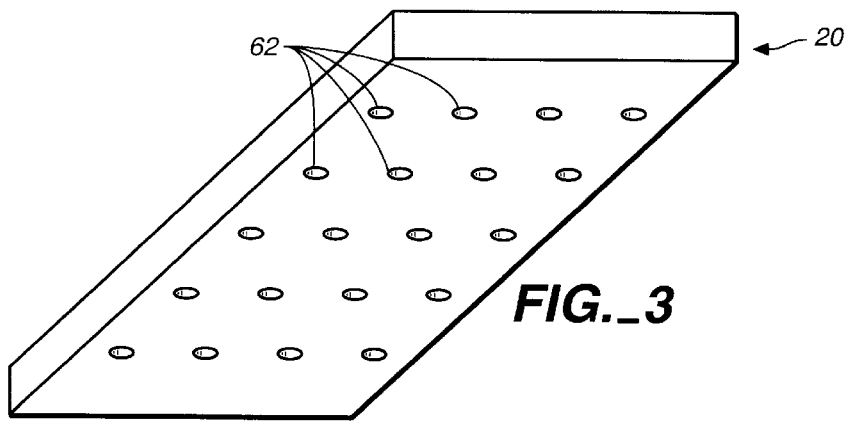
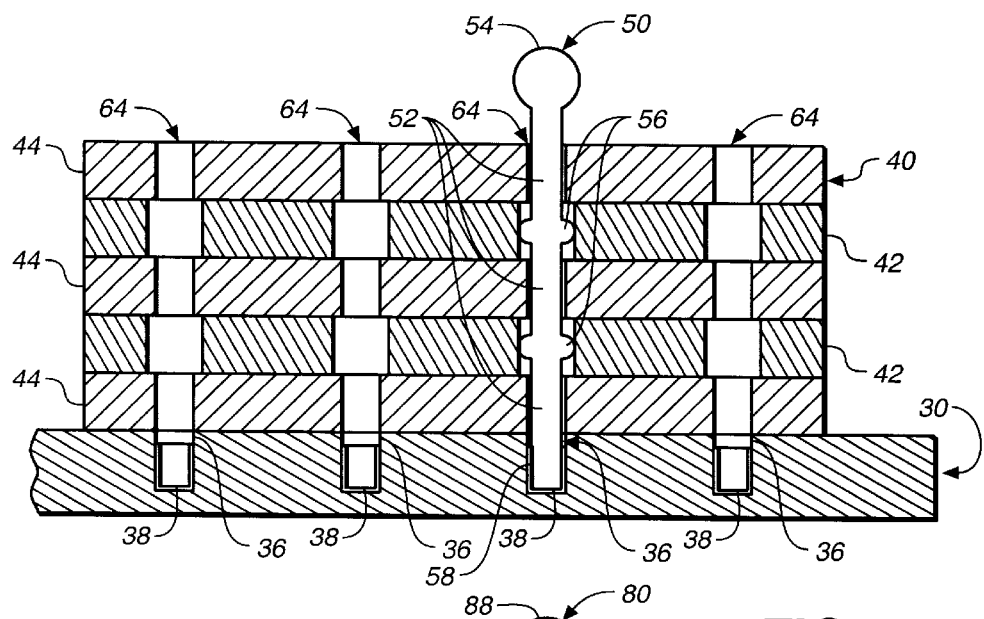
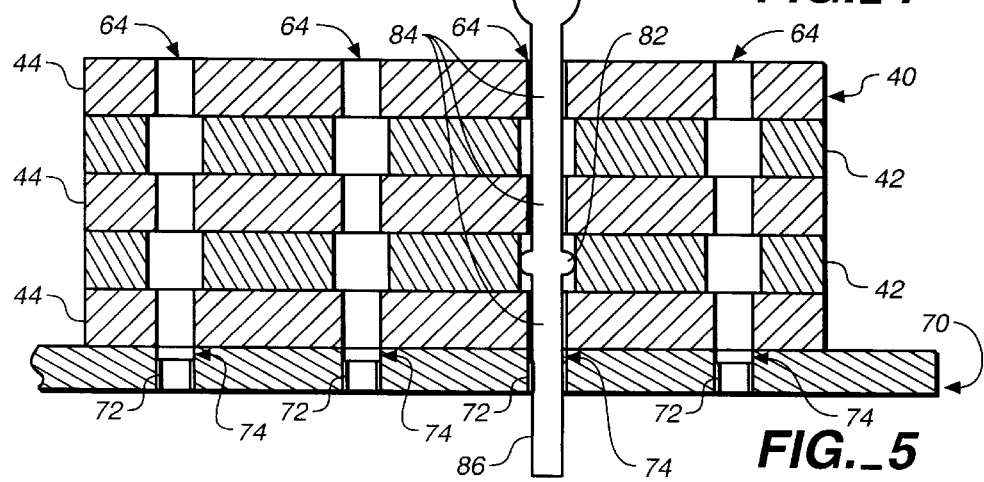

THREE-DIMENSIONAL PROGRAMMABLE CONNECTOR

CROSS-REFERENCE TO RELATED APPLICATIONS (Not applicable)

STATEMENT REGARDING FEDERALLY SPONSORED RESEARCH OR DEVELOPMENT (Not applicable)

BACKGROUND OF THE INVENTION

1. Field of the Invention

The invention relates to electrical devices, and more particularly, to connectors for connecting multiple circuits.

2. Description of Related Art

Following manufacture, integrated circuits are typically powered up and run for a test period prior to shipping to customers in order to weed out those devices which fail prematurely. This process is called burn-in and is typically performed at elevated temperatures to help accelerate these early failures, or "infant mortalities." The burn-in system typically consists of a burn-in tester which provides the electrical test signals to the packaged integrated circuit, referred to as the device under test ("DUT"), and an oven which provides the temperature acceleration. The DUT is loaded into a load board and placed in the oven. The load board is constructed using conventional printed circuit board techniques and materials. Electrical test signals are routed from the burn-in tester through the load board to the appropriate terminals or pins of the DUT package.

Conventionally, there is a wide variety of types of integrated circuit packages and number of pins on each package. In addition, for a given package type and pin count there is an infinite number of products which can be housed inside it. This means the routing of the electrical test signals to the pins of the package presents an extremely large number of combinations. Historically, a separate load board has been made for each product, wherein the traces on the load board which carry the electrical test signals are routed to the specific pins, or leads, of the product. This is a "hard wired" design which does not allow for changes in the routing of the electrical test signals. Additionally, if the product pinout changes, a new load board must be manufactured to be able to burn it in. Likewise, a new load board needs to be manufactured for every new product.

Load boards are expensive and their wiring to the burn-in tester is labor intensive and time-consuming. Part of the expense is due to a robustness requirement, whereby the load boards need to be able to operate at elevated temperatures (up to 350° C. or more), provide little if any signal degradation and remain reliable for one to two years of continuous operation at elevated temperatures. It therefore becomes important to minimize the need to replace load boards, to thereby reduce the production costs of integrated circuits. One way to minimize the need to replace load boards is to make them more versatile in their applicability.

BRIEF SUMMARY OF THE INVENTION

The present invention overcomes the deficiencies of the prior art by providing a burn-in system having a three-dimensional programmable connector for interfacing a load board with a burn-in tester. The three-dimensional programmable connector renders the load board more versatile, providing for numerous selectable routing configurations to thereby accommodate different burn-in tests to be conducted and different pinouts of the integrated circuit packages.

In accordance with the invention, the three dimensional programmable connector is provided with a plurality of planar electrodes which are selectively electrically connectable to each other and to a load board on which the integrated circuit is mounted. To implement the selective connection, programming pins are inserted in channels formed in the three-dimensional programmable connector in discrete configurations associated with unique routing schemes depending on the particular wiring configuration desired, thereby enabling efficient, repeatable and cost-effective testing and analysis of the integrated circuit.

The programming pins are configured to establish electrical connection between one or more of the planar electrodes and a conducting portion of the load board, and differently configured programming pins are provided to enable selective routing. In accordance with one embodiment, the programming pins are insertable to different depths in the channels of the connector, with the different depths determining the particular wiring connection.

BRIEF DESCRIPTION OF THE SEVERAL VIEWS OF THE DRAWING(S)

Many advantages of the present invention will be apparent to those skilled in the art with a reading of this specification in conjunction with the attached drawings, wherein like reference numerals are applied to like elements and wherein:

FIG. 1 is a schematic perspective view of a burn-in system in accordance with the invention;

FIG. 2 is a schematic perspective view showing a load board in connection with a device under test and a three-dimensional programmable connector in accordance with the invention;

FIG. 3 is a schematic perspective view of an illustrative device under test;

FIG. 4 is a schematic cross-sectional view of a three-dimensional programmable connector in accordance with a first embodiment of the invention; and FIG. 5 is a schematic cross-sectional view of a three-dimensional programmable connector in accordance with a second embodiment of the invention.

DETAILED DESCRIPTION OF THE INVENTION

FIG. 1 schematically shows the operation of a burn-in system in accordance with the invention. A DUT (device under test) 20 representing a package containing a manufactured integrated circuit (not shown) is mounted onto a load board 30 such that the integrated circuit is electrically connected with the load board. Also mounted onto load board 30 is a three-dimensional programmable connector 40. A burn-in tester 60 is electrically connected to the programmable connector 40 using cables 68. Burn-in tester 60 serves to issue test signals which are selectively conveyed to DUT 20 via three-dimensional programmable connector 40 and load board 30. The behavior of DUT 20 in response to the test signals, preferably under elevated temperature conditions, is then analyzed in order to provide a diagnosis of DUT 20.

Load board 30 is shown in more detail in FIG. 2. Conductive traces 34 are provided for conveying electrical signals between pads 32 and corresponding conductive portions, such as conducting cap-like sockets 38 (FIG. 4) disposed in holes 36. Pads 32 interface with leads 62 (FIG. 3) of the DUT 20, such that the pinout of the integrated circuit of DUT 20 is accommodated, preferably in a one-to-one correspondence between leads 62 of DUT 20 and pads 32. Pads 32 may alternatively be replaced with for example holes to matingly receive pins (not shown) protruding from DUT 20 when the testing of a package having the form of a pin grid array (PGA) is contemplated. Other types of packages which can be accommodated by the invention include for example BGAs (ball grid arrays), etc. Holes 36 of load board 30 interface with three-dimensional programmable connector 40 using insertable programming pins 50 in the manner described below.

FIG. 4 shows a cross-sectional view of the three-dimensional programmable connector 40 in connection with load board 30. Programmable connector 40 comprises a stack of two substantially planar electrodes 42 electrically isolated from each other, preferably by insulating layers 44 interspersed therebetween. Each planar electrode 42 is electrically connected to an associated terminal 66 (FIG. 1) of burn-in tester 60, via for example cables 68. Planar electrodes 42 and insulating layers 44 define a plurality of channels 64 passing therethrough, the channels 64 being in substantial registry with corresponding holes 36 of load board 30 when the three-dimensional programmable connector 40 is mounted in place on the load board. The mounting of connector 40 to load board 30 is detachable and may be accomplished using any known mechanical means. Additionally, although for purposes of illustration the three-dimensional programmable connector 40 is described in terms of two planar 42 electrodes and an array of 4×5(20) channels 64, it will appreciated that a different number of planar electrodes can be used and a different number and arrangement of channels 64 can be used depending on the particular application. Similarly, the shape of the programmable connector 40 can be adapted to conform to the shape of any load board and DUT and is not limited to the generally rectangular shape shown in the drawing figures.

Programming pins 50, shown in FIGS. 1 and 4 and in phantom in FIG. 2, are slidably insertable into channels 64 of three-dimensional programmable connector 40. In accordance with the invention, a plurality of programming pins 50 are provided and are selectively inserted into the three-dimensional programmable connector 40 depending on the desired testing routing configuration. As seen most clearly with reference to FIG. 4, each programming pin 50 is preferably provided with a head portion 54, a stem portion 52, and one or more contact portions 56 in electrical contact with each other and with a tip portion 58. Contact portions 56 are preferably resilient so as to establish good electrical contact with corresponding planar electrodes 42 of programmable connector 40. It is to be understood that several configurations of programming pins 50 are to be provided. Specifically, whereas programming pin 50 of FIG. 4 is provided with two contact portions 56 and in this configuration operates to close an electrical circuit between both planar electrodes 42 and conductive cap-like socket 38 of the corresponding hole 36, other pins 50 can be provided with a single contact portion 56, corresponding to either one of the two planar electrodes 42, to thereby enable selective closing of an electrical circuit between that single planar electrode and the conductive cap-like socket 38 of the corresponding hole 36 of load board 30. Of course, the maximum number of contact portions 56 of the pins 50 will depend on the number planar electrodes 42 of three-dimensional programmable connector 40, with the maximum number of contact portions 56 generally being equal to or less than the number of electrodes 42, and as mentioned above, the invention is not limited to two planar electrodes.

For easy identification, the head portions 54 of the differently configured programming pins 50 may be differently labeled or color coded. Additionally, individual portions of each programming pin 50 may be made distinguishable from each other, by color coding for instance, to enable an operator inserting the pins 50 into programmable connector 40 to identify the extent of the insertion and gauge which of the electrodes 42 have been reached by the contact portions 56 of the particular pin. This expedient is particularly important in an arrangement such as that illustrated in FIG. 5, wherein passage of programming pin 80 completely through load board 70 is contemplated. In the FIG. 5 arrangement, a load board 70 is provided with holes 74 in which are housed conductive portions such as cylindrical contacts 72. Each cylindrical contact 72 is in electrical communication with a corresponding pad 32 of the load board via a trace 34 as discussed above. The particular programming pin 80 shown in FIG. 5 is provided with a single contact portion 82 which is in electric contact with tip portion 86 via stem portion 84. Other pin configurations can have a different number and location of contact portions 82. A head portion 88, which may serve for labeling or handling, is also provided. Audible or tactile or other sensory feedback can be provided to the operator, such as clicking noises or varying resistance, to aid in locating the contact portions 82 during their passage through channels 64 to the desired depth. The extent to which the pins 80 are inserted into programmable connector 40 is critical, as the depth of insertion determines which contact portions 82 come into electrical contact with which layers 42, and thereby determines which layers 42 become part of the circuit closed by that particular pin 80. The clicking expedient can be provided by the springing force of resilient contact portions 82 as they traverse the channel 64, wherein the walls of the channel are provided with discontinuities such as at the transitions between the different layers representing the electrodes 42 and the insulating layers 44. To that end, channels 64, which are preferably cylindrical in shape, may be provided with larger diameters at the regions of the electrodes 42 than at the regions of the insulation layers 44. In addition to providing tactile feedback, this would provide natural resting positions of the pins, wherein good electrical contact between the pins and the planar electrodes is insured.

The above are exemplary modes of carrying out the invention and are not intended to be limiting. It will be apparent to one of ordinary skill in the art that modifications thereto can be made without inventive departure from the spirit and scope of the invention as set forth in the following claims.

What is claimed is:

1. A burn-in system for electronic circuit testing comprising:
    a burn-in tester for issuing test signals;
    a load board for delivering the test signals to the electronic circuit, the load board having at least one conductive portion corresponding to a lead of the electronic circuit and being in electrical communication with said lead;
    a three-dimensional programmable connector for selectively routing the test signals from the burn-in tester to the load board, the three-dimensional programmable connector having a plurality of substantially planar electrodes stacked in electrical isolation from each other and defining at least one channel passing therethrough; and at least one programming pin for removable insertion into the channel to thereby close an electrical circuit between at least two planar electrodes or between at least one planar electrode and a conductive portion of the load board.

2. The burn-in system of claim 1, wherein the programming pin is provided with at least one contact portion and wherein the closing of the electrical circuit by the programming pin is effected by electrical contact between the contact portion and a planar electrode.

3. The burn-in system of claim 1, wherein the load board is provided with holes corresponding to channels of the programmable connector, the holes being in substantial registry with the channels and each being adapted to matingly receive a programming pin therein.

4. The burn-in system of claim 3, wherein the holes each house an electrical contact which is in electrical communication with a lead of the electronic circuit.

5. The burn-in system of claim 1, wherein the programming pin is adapted to slide to varying depths in the channel, each depth representing a discrete routing configuration of the burn-in system.

6. The burn-in system of claim 1, wherein the planar electrodes define a plurality of channels adapted to receive one or more programming pins in discrete programming pin configurations, each configuration being associated with a unique routing scheme of the burn-in system.

7. A three-dimensional programmable connector for electrically connecting a burn-in tester having a plurality of terminals to a load board using one or more programming pins, the load board having a plurality of conductive portions corresponding to leads of a device under test, the three-dimensional programmable connector comprising:

a plurality of substantially planar electrodes stacked in electrical isolation from each other, each planar electrode being adapted for electrical communication with a corresponding terminal of the burn-in tester, the plurality of planar electrodes defining at least one channel for removable passage of a programming pin therethrough such that an electrical circuit is closed between at least two planar electrodes or between at least one planar electrode and a conductive portion of the load board.

8. The three-dimensional programmable connector of claim 7, wherein the planar electrodes define a plurality of channels adapted to receive one or more programming pins.

9. A three-dimensional programmable connector for electrically connecting a burn-in tester having a plurality of terminals to a load board adapted to receive a device under test (DUT) representing an electrical circuit, the load board having a plurality of conductive portions corresponding to leads of the device under test, the three-dimensional programmable connector comprising:

a plurality of substantially planar electrodes stacked in electrical isolation from each other, each planar electrode being adapted for electrical communication with a corresponding terminal of the burn-in tester, the plurality of planar electrodes defining at least one channel passing therethrough; and a programming pin adapted for removable passage at least partially through the channel and for closing an electrical circuit between at least two planar electrodes or between at least one planar electrode and a conductive portion of the load board.

10. A programming pin for use with a three-dimensional programmable connector having a plurality of substantially planar electrodes stacked in electrical isolation from each other and defining at least one channel passing therethrough, the three-dimensional programmable connector being adapted to complete an electrical connection between a burn-in tester and a device under test which is mounted on a load board having conductive portions in electrical communication with corresponding leads of the device under test, the programming pin comprising:

at least one contact portion; and a tip portion electrically connected to the contact portion, wherein the programming pin is adapted for removable insertion at least partially through a channel of the programmable connector and for closing an electrical circuit between at least two planar electrodes or between at least one planar electrode and a conductive portion of the load board.

* * * * *